United States Patent
Forkas (10) Patent No.: US 6,404,632 B1
(45) Date of Patent: Jun. 11, 2002

(54) MECHANICAL CONFIGURATION FOR RETAINING INBOARD MOUNTING HARDWARE ON FINNED HEAT DISSIPATING DEVICES

(75) Inventor: Jay R. Forkas, Rocklin, CA (US)

(73) Assignee: Hewlett-Packard Co., Palo Alto, CA (US)

( * ) Notice: Subject to any disclaimer, the term of this patent is extended or adjusted under 35 U.S.C. 154(b) by 0 days.

(21) Appl. No.: 09/849,167

(22) Filed: May 4, 2001

(51) Int. Cl.[7] .................................................. H05K 7/20
(52) U.S. Cl. ...................... 361/703; 361/704; 361/709; 361/710; 257/718; 257/719; 257/722; 174/16.3; 165/80.3; 165/185
(58) Field of Search ................................ 361/704, 707, 361/709, 710, 717–720, 695, 697–700; 257/706, 714, 715, 718, 719, 722, 727; 174/15.2, 16.1, 16.3; 165/80.3, 80.4

(56) References Cited

U.S. PATENT DOCUMENTS

| | | | | |
|---|---|---|---|---|
| 5,020,586 A | * | 6/1991 | Mansingh | 165/80.3 |
| 5,412,535 A | * | 5/1995 | Chao et al. | 361/700 |
| 5,558,155 A | * | 9/1996 | Ito | 165/80.3 |
| 5,880,930 A | * | 3/1999 | Wheaton | 361/690 |
| 5,947,192 A | * | 9/1999 | Kuo | 165/80.3 |
| 6,006,827 A | * | 12/1999 | Lu | 165/182 |
| 6,062,301 A | * | 5/2000 | Lu | 165/80.3 |
| 6,076,594 A | * | 6/2000 | Kuo | 165/80.3 |
| 6,199,625 B1 | * | 3/2001 | Guerrero | 165/80.3 |
| 6,282,093 B1 | * | 8/2001 | Goodwin | 361/704 |

* cited by examiner

Primary Examiner—Boris L. Chervinsky (57) ABSTRACT

A method and apparatus to retain mounting hardware on a heat-sink or heat-pipe. One embodiment of the invention involves a method to assemble a component having a heat dissipation device with a plurality of heat dissipation fins on a substrate. A second embodiment of the invention involves a method to assemble an electrical component having a heat dissipation device with a plurality of heat dissipation fins on a substrate. A third embodiment of the invention involves an assembled substrate, an electrical component, and a heat dissipation device attached to the electrical component, wherein the heat dissipation device includes heat dissipation fins with holes to contain and shims (or clips) to make captive within the holes, the hardware used to attach the heat dissipation device to the substrate.

19 Claims, 8 Drawing Sheets

MECHANICAL CONFIGURATION FOR RETAINING INBOARD MOUNTING HARDWARE ON FINNED HEAT DISSIPATING DEVICES

BACKGROUND OF THE INVENTION

1. Field of the Invention

This invention relates generally to a simplification of the attachment of a heat dissipation device to a substrate, and more specifically relates to eliminating the need for a complex hardware structure to attach a heat dissipation device to a substrate, and allowing the use of irregularly shaped fins on the heat dissipation device.

2. Description of the Prior Art

In many data processing systems (e.g., computer systems, programmable electronic systems, telecommunication switching systems, control systems, and so electrical components (e.g., power semiconductors, processor chips) that dissipate several watts are used. Such power dissipation can easily overheat an electrical component and cause a permanent or a temporary failure in operation. Therefore, the body of a high power dissipation electrical component is frequently thermally coupled to a heat dissipation device (e.g., a heat-sink, a heat-pipe, a fluid cooling system, a cooling fan, or an equivalent device).

However, such heat dissipation devices are frequently not able to cool such electrical components to an optimized extent. One fundamental reason for non-optimum cooling is that a hardware structure is frequently needed to hold the heat dissipation device mounting screws, washers, and compression springs in a subsystem for assembly on a substrate or an equivalent platform. Furthermore, such a hardware structure usually constrains the dimensions of the fins of a heat dissipation device because of the mounting screw positions in the hardware structure.

There are several problems with conventional solutions for cooling electrical components. For example, conventional cooling solutions have trouble with cooling electrical components located in limited irregular spaces, since the fins of the heat dissipation device are normally constrained to a rectangular dimensioned fin area that may be far smaller than the area available for an irregularly shaped fin. Furthermore, conventional hardware structures typically obstruct the airflow in at least some directions over the electrical components, when increasing power dissipation levels in data processing systems are increasing the airflow needed to keep these data processing systems sufficiently cool. Therefore, conventional cooling solutions do not optimize the total cooling fin surface area by utilizing irregular fin geometries, and are not rotationally independent with respect to facilitating airflow. Furthermore, conventional cooling solutions typically require a hardware structure with a large part count and a considerable amount of labor for assembly.

Figure 1:
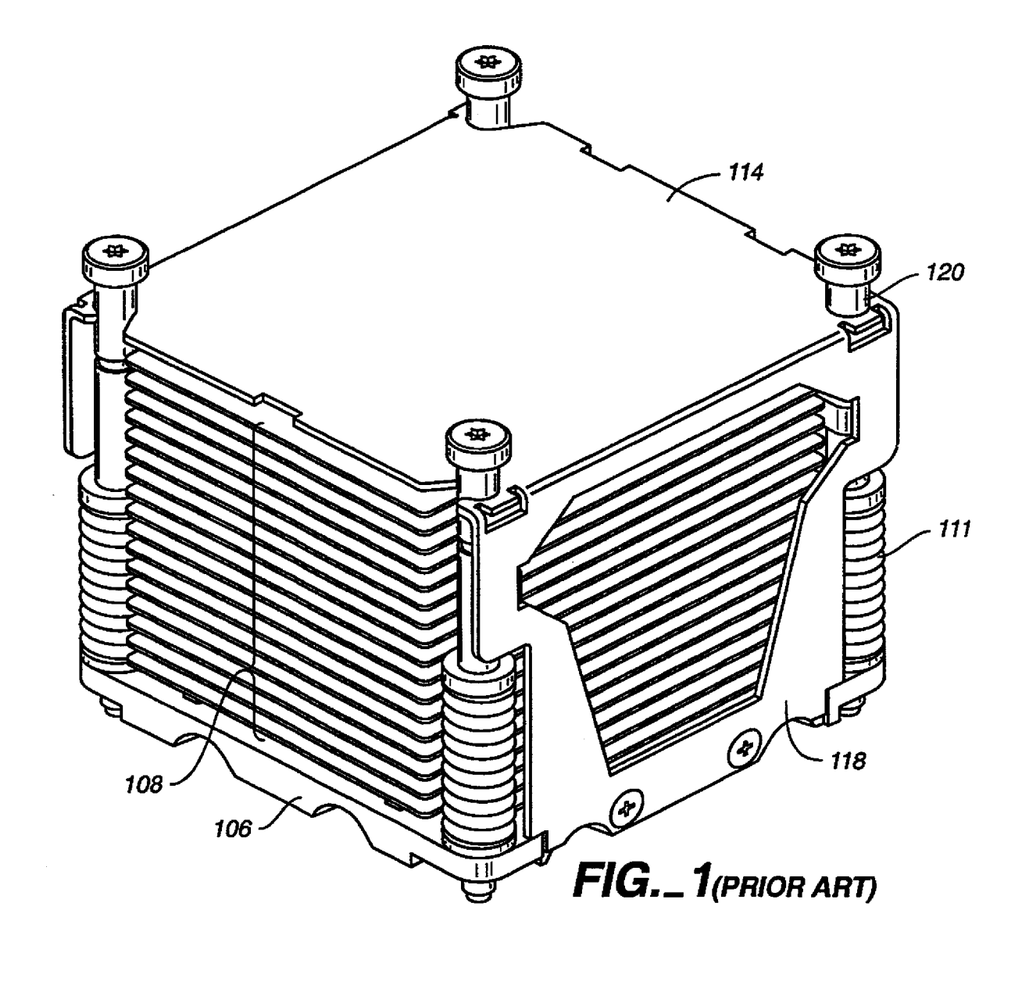
FIG. 1 illustrates a conventional hardware structure for attaching the heat dissipation fins of a heat dissipation device to a substrate.

FIG. 1 illustrates a conventional hardware structure for attaching the heat dissipation fins of a heat dissipation device to a substrate. The heat dissipation device comprises a vertically stacked plurality of rectangular heat dissipation fins 108, which are enclosed by a hardware structure 114. The hardware structure 114 includes two or more walls 118 (one is shown), and the hardware structure is typically fabricated of the same metal as the heat dissipation device. The hardware structure 114 holds a plurality of screws 120 (typically four long screws are used) and screw springs 111 to attach a base 106 of the heat dissipation device to the substrate (not shown). The walls 118 provide rigidity to the hardware structure, but the walls 118 also reduce or block airflow that is perpendicular to the walls 118, thus restricting the placement and orientation of the heat dissipation device for achieving effective forced airflow convective cooling.

Conventional solutions for cooling electrical components involve a variety of unattractive remedies, none of which is in widespread use. The most obvious conventional solution to improve the electrical component cooling is a new hardware structure design with much larger dimensions. Unfortunately, this would tax the system design with new constraints, such as increased size and a more expensive heat dissipation device hardware structure attachment.

It would be desirable to provide an optimized cooling solution that is less expensive and more manufacturing-friendly, for attaching a heat dissipation device to a component mounted on a substrate or an equivalent platform.

SUMMARY OF THE INVENTION

An object of the present invention is to provide an optimized cooling solution that is less expensive and more manufacturing-friendly, for attaching a heat dissipation device to a component mounted on a substrate or an equivalent platform.

A first aspect of the invention is directed to a method to assemble a component having a heat dissipation device with a plurality of heat dissipation fins on a substrate. The method includes attaching the heat dissipation device to the component, wherein one or more of the plurality of heat dissipation fins of the heat dissipation device have one or more holes to substantially retain one or more connectors to connect the heat dissipation device to the substrate, placing the heat dissipation device and the component on the substrate, attaching the heat dissipation device and the component to the substrate using one or more connectors, and placing one or more hardware retainer shims on one of the heat dissipation fins.

A second aspect of the invention is directed to a method to assemble an electrical component having a heat dissipation device with a plurality of heat dissipation fins on a substrate. The method includes attaching the heat dissipation device to the electrical component, wherein one or more of the plurality of heat dissipation fins of the heat dissipation device have one or more holes to substantially retain one or more connectors to connect the heat dissipation device to the substrate; placing the heat dissipation device and the electrical component on the substrate; placing one or more hardware retainer shims on one of the plurality of heat dissipation fins; and attaching the heat dissipation device and the electrical component to the substrate using the one or more connectors.

A third aspect of the invention is directed to an assembled substrate. The assembled substrate includes a substrate having a plurality of conductive contacts; an electrical component having a plurality of leads; a heat dissipation device attached to the electrical component, wherein the heat dissipation device includes a plurality of heat dissipation fins with holes to retain one or more connectors designed to attach the heat dissipation device to the substrate; and one or more hardware retainer shims placed on one of the plurality of heat dissipation fins.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides an optimized cooling solution that is inexpensive and manufacturing-friendly, for attaching a heat dissipation device to an electrical component mounted on a substrate, such as a printed circuit board (PCB) or multi-chip module. While the discussion below is directed to an application of the invention to power semiconductors assembled on a substrate (e.g., a PCB), the invention can also be applied to any type of electrical component assembled on any type of substrate (e.g., multi-chip modules, and other substrates upon which electrical components can be assembled).

Figure 2:
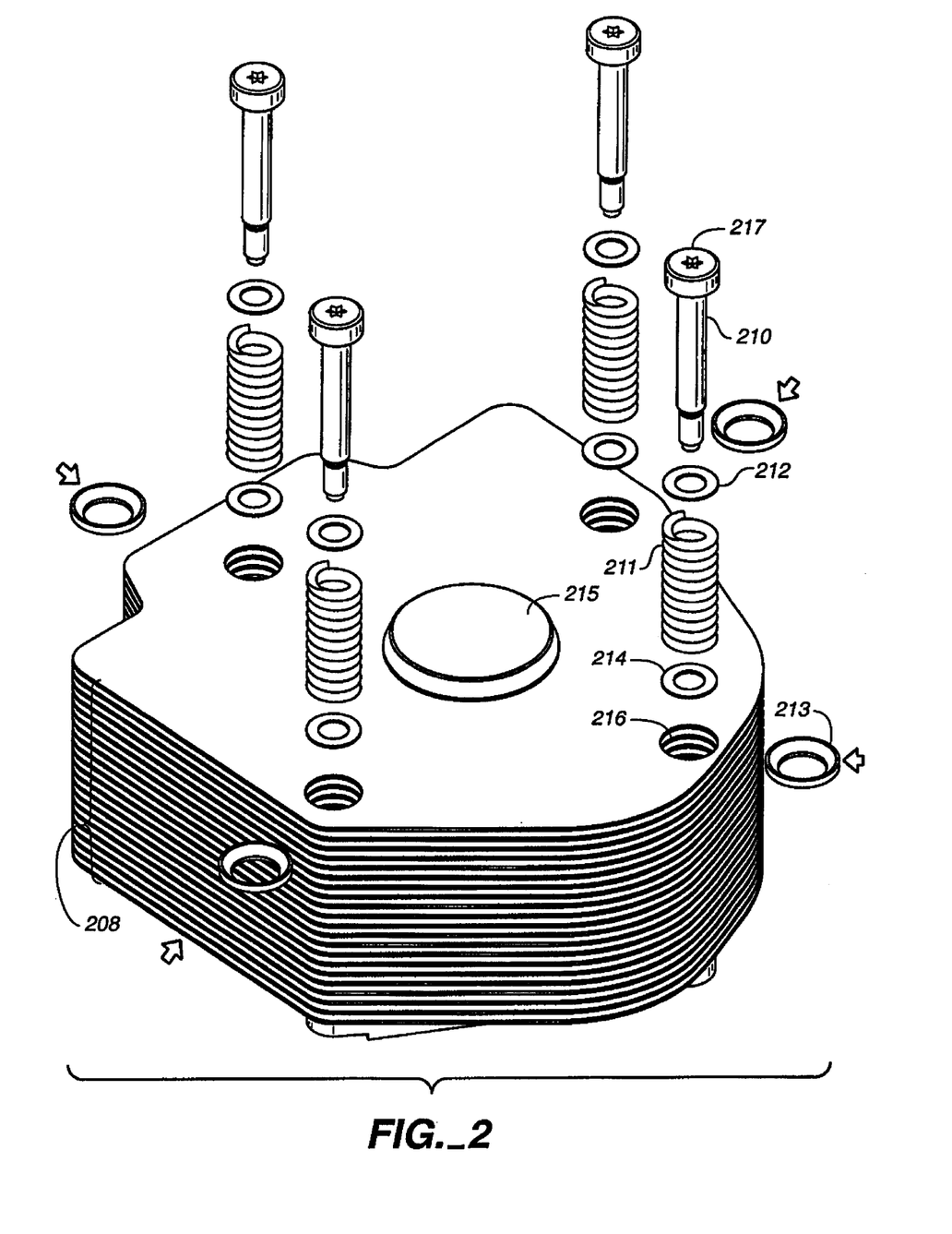
FIG. 2 illustrates an assembly of a heat dissipation device (e.g., a heat-pipe) according to one embodiment of the invention.

FIG. 2 illustrates an assembly of a heat dissipation device (e.g., a heat-pipe) according to one embodiment of the invention. The heat dissipation device assembly includes several heat dissipation fins 208. The heat dissipation fins 208 are stacked on spacers (not shown) or fin flanges (not shown) to maintain a uniform stacking separation. The heat dissipation device assembly also includes four short screws 210, four springs 211, four washers 212, four hardware retainer shims 213, four washers 214, and a molded top cap 215. The heat dissipation fins have four holes 216 that are aligned to form vertical wells to receive the four short screws 210, four springs 211, four washers 212, four hardware retainer shims 213, and four washers 214. Each of the four hardware retainer shims 213 are slipped into snug positions centered around one of the four holes 216, between two heat dissipation fins 208 that are above the screw heads 217 of the four short screws 210.

Each hardware retainer shim 213 had a height approximately equal to the vertical spacing between two adjacent heat dissipation fins 208, and a diameter greater than the diameter of a heat dissipation fin hole 216. Each hardware retainer shim 213 has a hole with a diameter smaller than the diameter of the screw head 217 of a short screw 210. Each hardware retainer shim 213 preferably has a protruding flange on the bottom surface to snugly fit inside a heat dissipation fin hole 216, and preferably has a bevel or chamfer (e.g., a 45° bevel or chamfer) on the top surface to provide a guide for a screwdriver (not shown) to align to the screw head 217 of the short screw 210 below the hardware retainer shim 213. The bevel or chamfer can have any angle of beveling, or not have beveling in alternative embodiments of the invention.

Figure 3A:
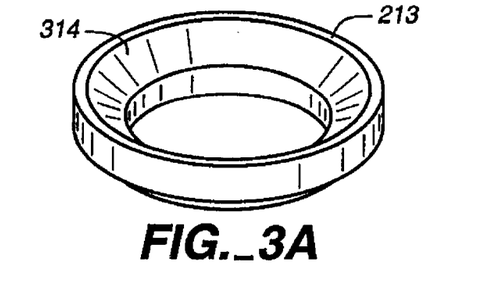
FIG. 3A illustrates a detailed top perspective view of one embodiment of a hardware retainer shim shown in FIG. 2.

FIG. 3A illustrates a detailed top perspective view of a hardware retainer shim 213 shown in FIG. 2. Here, the hardware retainer shim 213 has a 45° bevel 314 on the hardware retainer shim 213, which preferably is made of a ring or ferrule. The hardware retain shift 213 can be fabricated from a metal, a ceramic, a glass, or even a plastic in alternative embodiments.

Figure 3B:
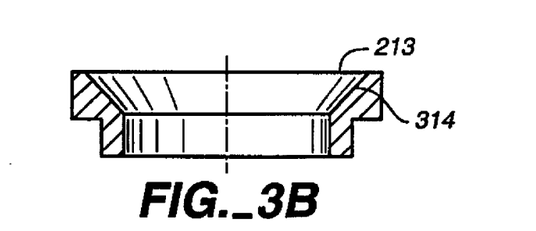
FIG. 3B illustrates a detailed cross-sectional view of the hardware retainer shim shown in FIG. 3A.

FIG. 3B illustrates a detailed cross-sectional view of the hardware retainer shim 213 shown in FIG. 3A. A cross-sectional view of the bevel 314 is also illustrated.

Figure 3C:
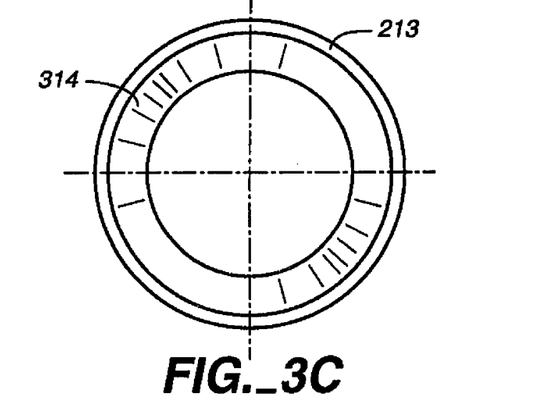
FIG. 3C illustrates a detailed top view of the hardware retainer shim shown in FIG. 3A.

FIG. 3C illustrates a detailed top view of the hardware retainer shim 213 shown in FIG. 3A. The detailed top view includes a view of the bevel 314

Figure 3D:
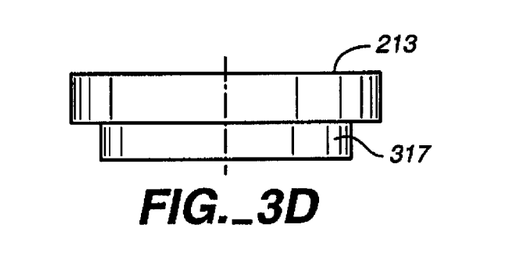
FIG. 3D illustrates a side view of the hardware retainer shim shown in FIG. 3A.

FIG. 3D illustrates a side view of the hardware retainer shim 213 shown in FIG. 3A. This embodiment has a lower flange 317 that has an outer diameter small enough to fit inside a heat dissipation fin hole 216 shown in FIG. 2. The height of the lower flange 317 should preferably be sufficient to snugly hold the hardware retainer shim 213 in the heat dissipation fin hole 216. However, the sum of the height of the upper body of the hardware retainer shim 213 and the height of the lower flange 317 preferably is not much greater than the spacing gap between two heat dissipation fins 208, or it will be difficult to slide the hardware retainer shim 213 between two heat dissipation fins 208.

Figure 4:
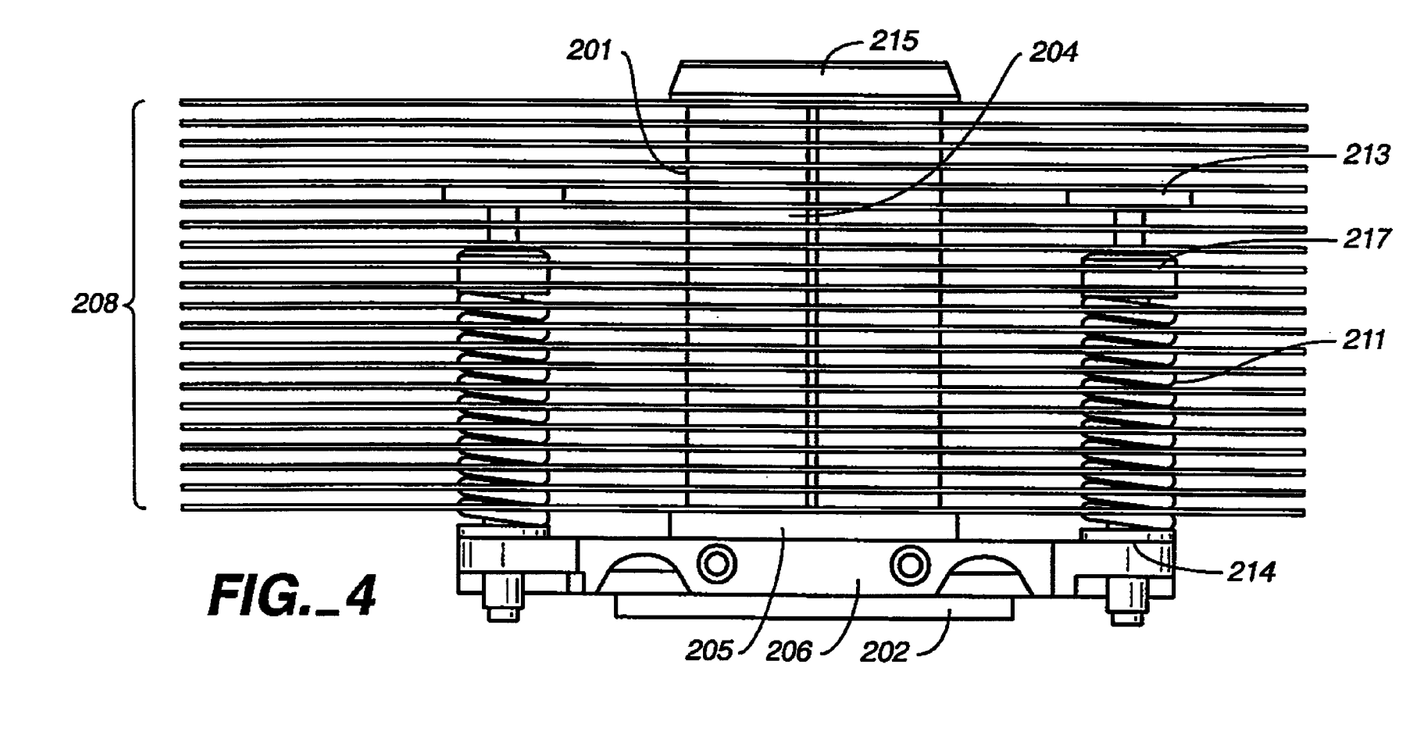
FIG. 4 illustrates a side view of the heat dissipation device assembly shown in FIG. 2.

FIG. 4 illustrates a side view of the heat dissipation device assembly shown in FIG. 2. A side view is presented of a conventional heat-pipe outer tube 201, a heat-spreader plate 202, a heat-pipe inner tube 204, a heat-pipe EMI ring 205, a heat-pipe base 206, and several heat dissipation fins 208. The heat dissipation fins 208 are stacked on spacers (not shown) or fin flanges (not shown) to maintain a uniform stacking separation.

This side view of the heat dissipation device assembly also shows the heat dissipation fins 208 have holes (not shown) that are aligned to form two vertical wells to receive the two short screws (not shown), two springs 211, two top washers (not shown), two hardware retainer shims 213, and two bottom washers (not shown). Each of the two hardware retainer shims 213 is in a snug position radially centered above the screw heads 217 of the two short screws, between two heat dissipation fins 208.

Figure 5:
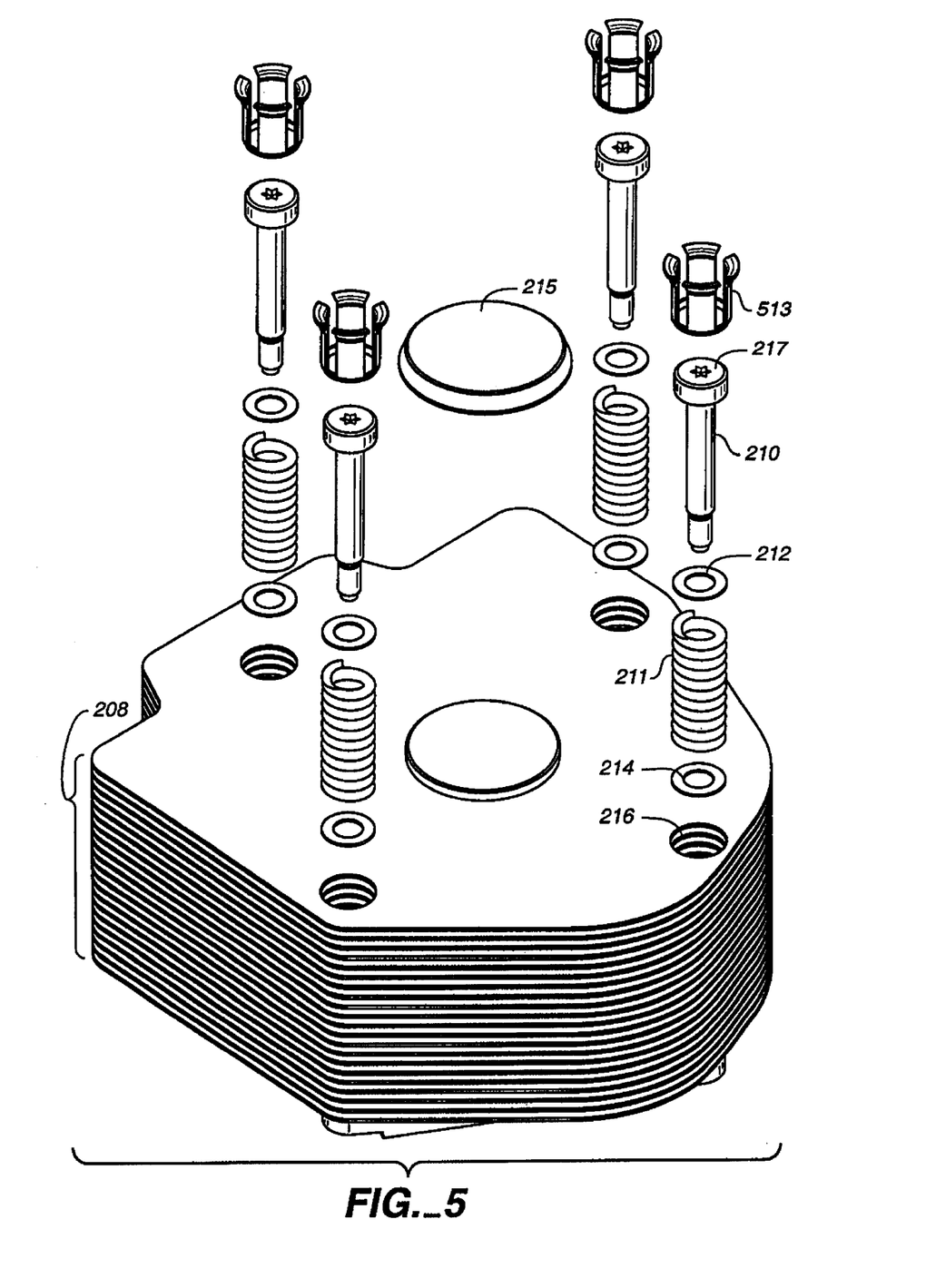
FIG. 5 illustrates an assembly of a heat dissipation device (e.g., a heat-pipe) according to another embodiment of the invention.

FIG. 5 illustrates an assembly of a heat dissipation device (e.g., a heat-pipe) according to another embodiment of the invention. The heat dissipation device assembly includes several heat dissipation fins 208. The heat dissipation fins 208 are stacked on spacers (not shown) or fin flanges (not shown) to maintain a uniform stacking separation. The heat dissipation device assembly also includes four short screws 210, four springs 211, four washers 212, four spring clip hardware retainer shims 513, four washers 214, and a molded top cap 215. The heat dissipation fins have four holes 216 that are aligned to form vertical wells to receive the four short screws 210, four springs 211, four washers 212, four spring clip hardware retainer shims 513, and four washers 214. Each of the four spring clip hardware retainer shims 513 are inserted into snug positions centered around one of the four holes 216, into several heat dissipation fins 208 that are above the screw heads 217 of the four short screws 210.

A hardware retain shim 513 of this type can be fabricated from a resilient metal, or a resilient heat-resistant plastic in alternative embodiments.

Each hardware retainer shim 513 has a diameter slightly more than the diameter of a heat dissipation fin hole 216. Each hardware retainer shim 513 has a hole with a diameter smaller than the diameter of the screw head 217 of a short screw (not shown). Each hardware retainer shim 513 preferably has a protruding flange on the top surface to snugly fit over the rim of a heat dissipation fin hole 216.

Figure 6:
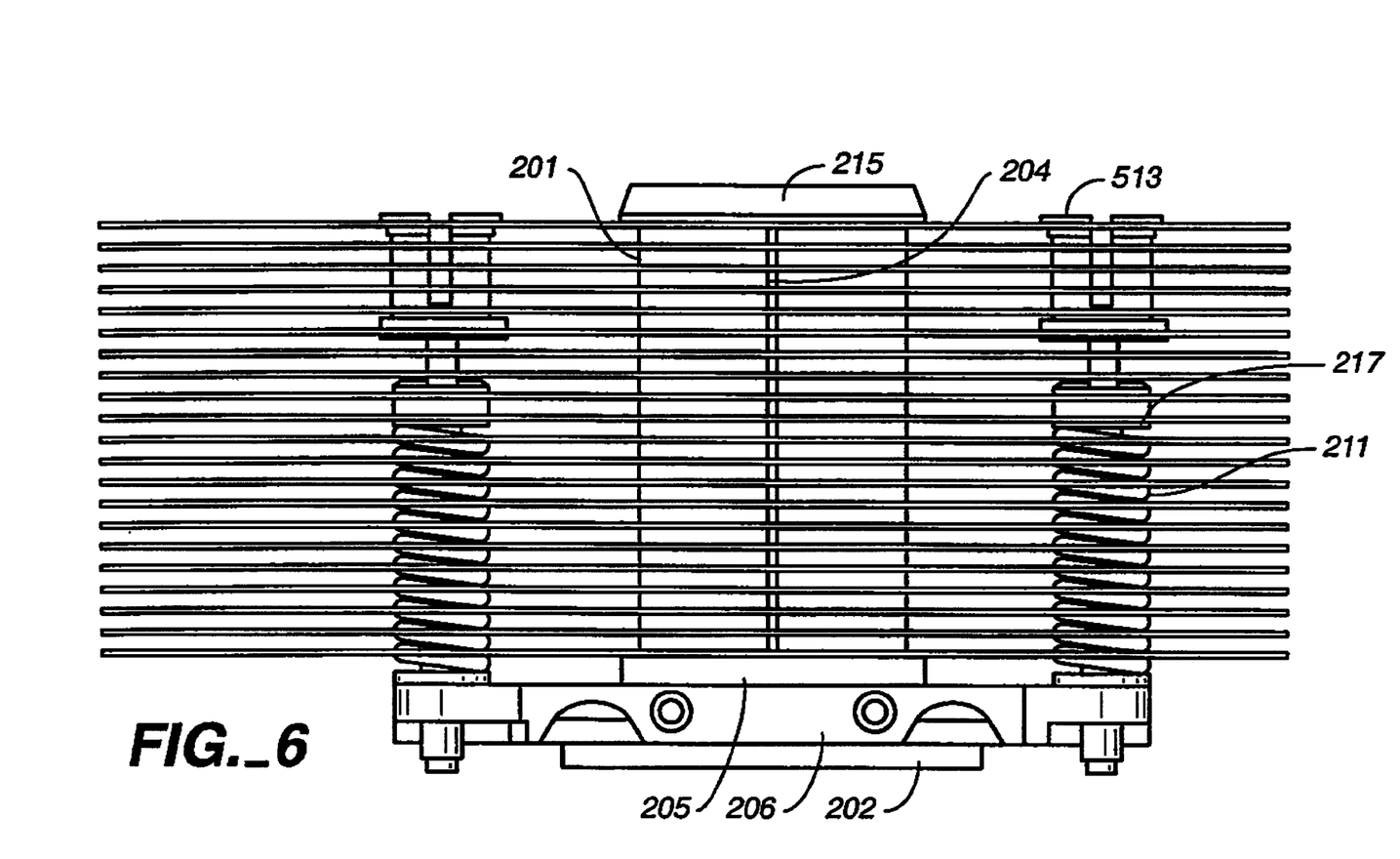
FIG. 6 illustrates a side view of the heat dissipation device assembly shown in FIG. 5.

FIG. 6 illustrates a side view of the heat dissipation device assembly shown in FIG. 5. A side view is presented of a conventional heat-pipe outer tube 201, a heat-spreader plate 202, a heat-pipe inner tube 204, a heat-pipe EMI ring 205, a heat-pipe base 206, and several heat dissipation fins 208. The heat dissipation fins 208 are stacked on spacers (not shown) or fin flanges (not shown) to maintain a uniform stacking separation.

This side view of the heat dissipation device assembly also shows the heat dissipation fins 208, two springs 211, and two hardware retainer shims 513. Each of the two hardware retainer shims 513 are inserted in heat dissipation fins 208 in positions that are radially centered above the screw heads 217 of the two short screws (not shown).

Figure 7:
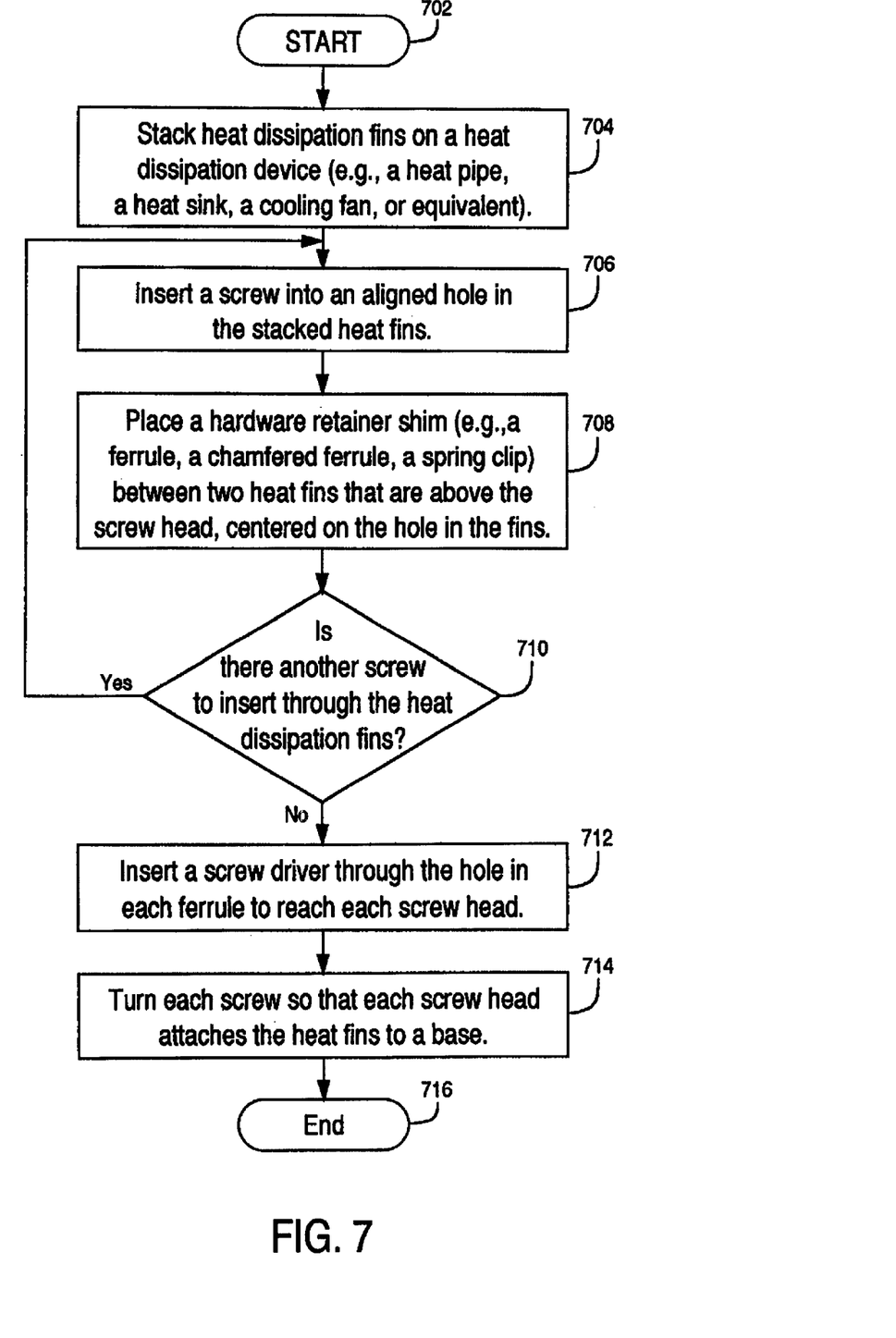
FIG. 7 shows one flow chart for a method to assemble fins on a structure as shown in FIG. 4 in accordance with one embodiment of the present invention.

FIG. 7 shows one flow chart for a method to assemble fins on a structure as shown in FIG. 4 in accordance with one embodiment of the present invention. The method starts in operation 702, and is followed by operation 704. In operation 704, the heat-dissipation fins are stacked on a structure (e.g., a heat-pipe, heat-sink, or an equivalent). In operation 706, a screw is inserted into a well of aligned holes in the stacked heat-dissipattion fins. In operation 708, the hardware retaining shim (a ferrule, a chamfered ferrule, or a spring clip) is placed on a heat-dissipation fin that is above the screw head of the screw. Then operation 710 is next, where a determination is made if it necessary to repeat steps 706 and 708 for additional screws. Then operation 712 is next. In operation 712, a screwdriver is inserted into each well, through the hole in the hardware retainer shim to reach each screw head. In operation 714, the screwdriver turns each screw to attach the heat-dissipation device to the substrate. Operation 716 is the end of the method.

Figure 8:
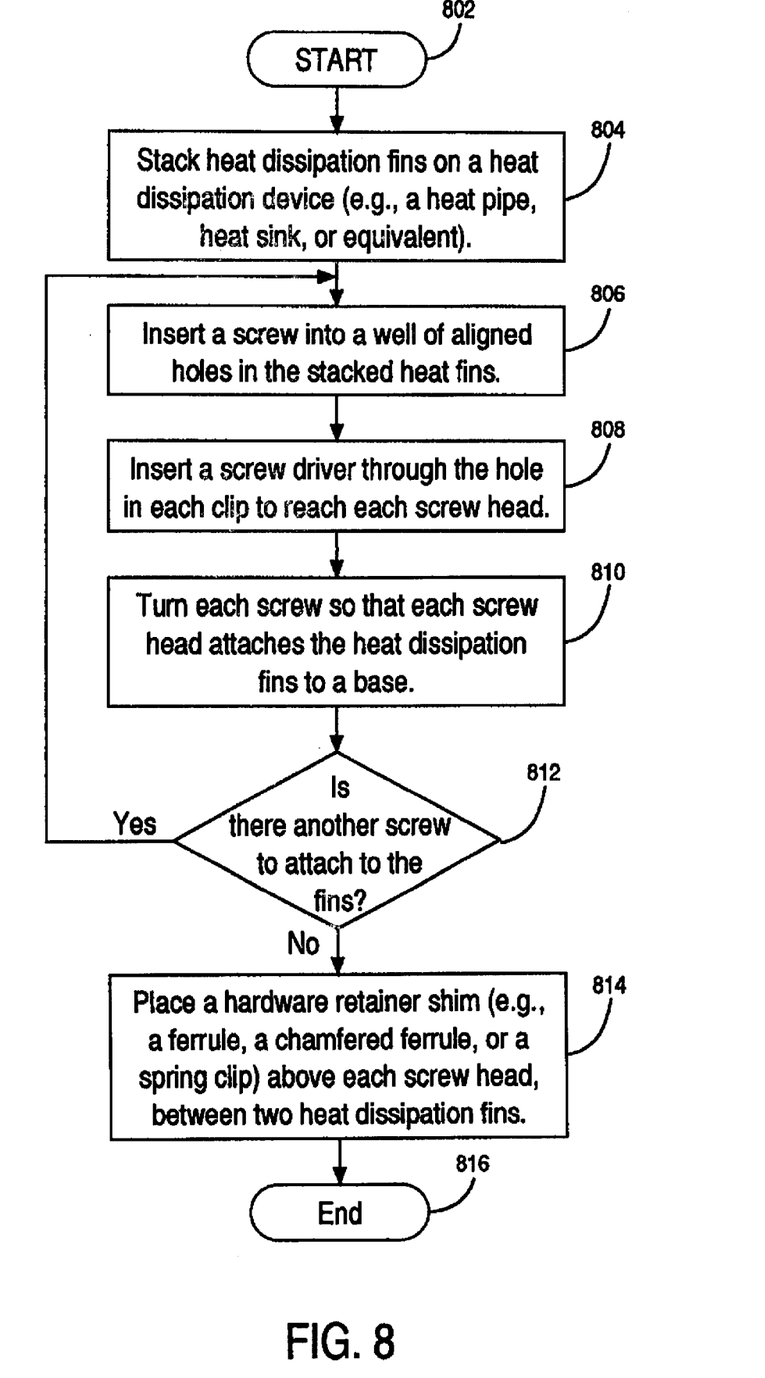
FIG. 8 shows another flow chart for a method to assemble fins on a structure as shown in FIG. 4 in accordance with an alternative embodiment of the present invention.

FIG. 8 shows another flow chart for a method to assemble fins on a structure as shown in FIG. 4 in accordance with another embodiment of the present invention. The method starts in operation 802, and is followed by operation 804. In operation 804, the heat-dissipation fins are stacked on a heat dissipation device (e.g., a heat-pipe, heat-sink, fluid cooling device, cooling fan, or an equivalent). In operation 806, a screw is inserted into a well of aligned holes in the stacked heat-dissipation fins. Then operation 808 is next. In operation 808, a screwdriver is inserted into each well to reach each screw head. In operation 810, the screwdriver turns each screw to attach the heat-dissipation device to the substrate. In operation 812, the operations 806, 808, and 810 are repeated for each screw. In operation 814, a hardware retaining shim is placed on a heat-dissipation fin that is above each screw head of each screw. Operation 816 is the end of the method.

The embodiments of the invention discussed above used examples of electrical components. However, alternative embodiments of the invention can be applied to other heat generating components (e.g., engines, generators, or other heat generating devices). Additionally, various embodiments of the invention that are applied to electrical component can be applied to PCBs using throught-hole technology or surface mount technology, or other types of electrical component substrates (e.g., multi-chip modules and flexible substrates).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method for retaining mounting hardware on a heat dissipation device that includes a plurality of heat dissipation fins that have an opening extending therethrough comprising:

inserting mounting hardware such that said mounting hardware extends through some of said openings in said plurality of heat dissipation fins; and placing a hardware retainer shim on one of said plurality of heat dissipation fins such that said hardware retainer shim extends over said opening, said hardware retainer shim including an opening that extends therethrough for providing access to said mounting hardware.

2. The method of claim 1 wherein said mounting hardware further includes a screw, said method further comprising extending a screwdriver through said opening in said hardware retainer shim and rotating said screw.

3. The method of claim 1 wherein said step of placing a hardware retainer shim on one of said plurality of heat dissipation fins further comprises inserting said hardware retainer shim between two adjoining heat dissipation fins.

4. The method of claim 1 wherein said hardware retainer shim is operable to make said mounting hardware captive within some of said openings in said plurality of heat dissipation fins.

5. The method of claim 1, wherein said heat dissipation device is chosen from a group of heat dissipation devices consisting of: a heat-pipe, a heat-sink, a fluid cooling system, and a cooling fan.

6. The method of claim 1 wherein said hardware retainer shim has a flange that protrudes from the bottom surface thereof, said step of placing said hardware retainer shim on one of said plurality of heat dissipation fins further comprising placing said hardware retainer shim on one of said plurality of heat dissipation fins such that said flange extends into said opening in said one of said plurality of heat dissipation fins.

7. The method of claim 2 wherein said hardware retainer shim has an upwardly extending portion, said step of placing said hardware retainer shim on one of said plurality of heat dissipation fins further comprising inserting said hardware retainer shim through some of said openings in said plurality of heat dissipation fins.

8. A method for assembling a heat dissipation device with a plurality of heat dissipation fins comprising:

stacking a plurality of heat dissipation fins on a heat dissipation device that includes a base, each of said plurality of heat dissipation fins including an opening that extends therethrough;

inserting a screw into said opening;

placing a hardware retainer shim on one of said plurality of heat dissipation fins such that said hardware retainer shim extends over said opening, said hardware retainer shim including an opening that extends therethrough; and attaching said heat dissipation device to said base by extending a screwdriver through said opening in said hardware retainer shim and rotating said screw.

9. The method of claim 8 wherein said heat dissipation fins are separated by a vertical spacing that is approximately equal to the height of said shim.

10. The method of claim 8 wherein step of placing a hardware retainer shim on one of said plurality of heat dissipation fins further comprises inserting said hardware retainer shim between two adjoining heat dissipation fins.

11. The method of claim 8 wherein said heat dissipation device is chosen from a group of heat dissipation devices consisting of: a heat-pipe, a heat-sink, a fluid cooling system, and a cooling fan.

12. The method of claim 8 wherein said hardware retainer shim has a top surface that is beveled, said hardware retainer shim operable to make said screw captive within some of said openings in said plurality of heat dissipation fins.

13. The method of claim 8 wherein said hardware retainer shim has a flange that protrudes from the bottom surface thereof, said hardware retainer shim operable to make said screw captive within some of said openings in said plurality of heat dissipation fins.

14. An assembly comprising
   a heat dissipation device that includes a plurality of heat dissipation fins, each of said heat dissipation fins including an opening extending therethrough;
   mounting hardware disposed within some of said openings in said plurality of heat dissipation fins; and
   one or more hardware retainer shim placed on one of said plurality of heat dissipation fins, said hardware retainer shim having an opening extending therethrough for providing access to said mounting hardware.

15. The assembly of claim 14 wherein said hardware retainer shim has a flange that protrudes from the bottom surface thereof.

16. The assembly of claim 14 wherein said hardware retainer shim has a top surface that is beveled.

17. The assembly of claim 14 wherein said heat dissipation device is chosen from a group of heat dissipation devices consisting of: a heat-pipe, a heat-sink, a fluid cooling system, and a cooling fan.

18. The assembly of claim 14 wherein said mounting hardware includes one or more screw disposed within some of said openings in said plurality of heat dissipation fins.

19. The assembly of claim 18 wherein said mounting hardware includes one or more spring disposed within some of said openings in said plurality of heat dissipation fins.

* * * * *